(12) United States Patent
Hsu et al.

(10) Patent No.: US 9,972,644 B2
(45) Date of Patent: May 15, 2018

(54) SEMICONDUCTOR DEVICE AND METHOD FOR FORMING THE SAME

(71) Applicant: UNITED MICROELECTRONICS CORP., Hsin-Chu (TW)

(72) Inventors: Chia-Fu Hsu, Tainan (TW); Chun-Yuan Wu, Yun-Lin County (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 10 days.

(21) Appl. No.: 14/872,156

(22) Filed: Oct. 1, 2015

(65) Prior Publication Data

US 2017/0062484 A1 Mar. 2, 2017

(30) Foreign Application Priority Data

Aug. 28, 2015 (TW) .............................. 104128350 A

(51) Int. Cl.
| | | |
|---|---|---|
| *H01L 29/12* | (2006.01) | |
| *H01L 27/12* | (2006.01) | |
| *H01L 29/786* | (2006.01) | |
| *H01L 29/51* | (2006.01) | |
| *H01L 29/24* | (2006.01) | |
| *H01L 23/528* | (2006.01) | |
| *H01L 29/66* | (2006.01) | |
| *H01L 21/02* | (2006.01) | |

(Continued)

(52) U.S. Cl.
CPC .... *H01L 27/1237* (2013.01); *H01L 21/02107* (2013.01); *H01L 21/02323* (2013.01); *H01L 21/02565* (2013.01); *H01L 21/441* (2013.01); *H01L 21/76897* (2013.01); *H01L 23/528* (2013.01); *H01L 27/1225* (2013.01); *H01L 27/1259* (2013.01); *H01L 29/24* (2013.01); *H01L 29/512* (2013.01); *H01L 29/66969* (2013.01); *H01L 29/7869* (2013.01)

(58) Field of Classification Search
CPC .......... H01L 29/7869; H01L 29/78696; H01L 29/4908; H01L 29/78648; H01L 27/14692; H01L 29/1054; H01L 29/42384; H01L 29/786
See application file for complete search history.

(56) References Cited

U.S. PATENT DOCUMENTS 7,598,520 B2 * 10/2009 Hirao .................. H01L 29/7869
257/352
8,502,229 B2 8/2013 Kim
(Continued)

*Primary Examiner* — Bradley K Smith
*Assistant Examiner* — David Goodwin
(74) *Attorney, Agent, or Firm* — Winston Hsu

(57) ABSTRACT

The present invention provides a semiconductor device and a method of forming the same, and the semiconductor device including a substrate, an oxide semiconductor layer, two source/drain regions, a high-k dielectric layer and a bottom oxide layer. The oxide semiconductor layer is disposed on a first insulating layer disposed on the substrate. The source/drain regions are disposed on the oxide semiconductor layer. The high-k dielectric layer covers the oxide semiconductor layer and the source structure and the drain regions. The bottom oxide layer is disposed between the high-k dielectric layer and the source/drain regions, wherein the bottom oxide layer covers the source/drain regions and the oxide semiconductor layer.

9 Claims, 5 Drawing Sheets

(51) Int. Cl.
*H01L 21/441* (2006.01)
*H01L 21/768* (2006.01)

(56) References Cited

U.S. PATENT DOCUMENTS

| | | |
|---|---|---|
| 8,546,800 B2 | 10/2013 | Tsang |
| 8,643,006 B2 | 2/2014 | Chen |
| 8,728,862 B2 | 5/2014 | Ha |
| 9,035,297 B2 | 5/2015 | Park |
| 9,035,313 B2 | 5/2015 | Jeong |
| 2009/0087954 A1 | 4/2009 | Lin |
| 2009/0278120 A1* | 11/2009 | Lee .................. H01L 29/7869 257/43 |
| 2009/0321732 A1 | 12/2009 | Kim et al. |
| 2010/0038641 A1* | 2/2010 | Imai .................. H01L 29/7869 257/57 |
| 2013/0309808 A1* | 11/2013 | Zhang .............. H01L 29/78648 438/104 |
| 2014/0001465 A1* | 1/2014 | Yamazaki ......... H01L 29/66969 257/43 |
| 2014/0217400 A1 | 8/2014 | Yan |
| 2015/0162452 A1* | 6/2015 | Koezuka ........... H01L 29/78606 257/43 |
| 2015/0179810 A1 | 6/2015 | Yamazaki |
| 2015/0221775 A1* | 8/2015 | Yamazaki ........... H01L 29/7869 257/43 |
| 2015/0228799 A1* | 8/2015 | Koezuka .............. H01L 27/124 257/43 |

* cited by examiner

SEMICONDUCTOR DEVICE AND METHOD FOR FORMING THE SAME

BACKGROUND OF THE INVENTION

1. Field of the Invention

The present invention relates to a semiconductor structure and a method for forming the same, and more particularly, to a semiconductor structure having an oxide semiconductor layer and a method for forming the same.

2. Description of the Prior Art

In the modern society, the micro-processor systems comprising integrated circuits (IC) are ubiquitous devices, being utilized in diverse fields such as automatic control electronics, mobile communication devices and personal computers. With the development of technology and the increase of original applications for electronical products, the IC devices are becoming smaller, more delicate and more diversified.

In a wide variety of materials, indium oxide ($In_2O_3$), tin oxide ($SnO_2$) and zinc oxide (ZnO) are generally known transparent conductive oxide. Indium tin oxide is (ITO), when being formed of a thin film, can be used as a transparent electrode in a flat panel display or a touch sensor of a capacitance type touch panel. Tin oxide and zinc oxide can be used in a transparent solar cell electrode. However, these materials are essentially semiconductor material, and it is desired for the researchers to develop a semiconductor device by using their semiconductor material property, such as an oxide semiconductor transistor.

However, due to oxidation of the semiconductor material itself, when using of this oxide semiconductor material, it is easy to damage the oxide semiconductor layer during the production process, thus affecting the performance of the product. Therefore, for a semiconductor device having an oxide semiconductor material, there is still a need for a better design or a manufacturing method, thereto gain better quality.

SUMMARY OF THE INVENTION

The present invention therefore provides a semiconductor structure with a dual gate structure and a method for forming the same, in order to gain a better product performance.

In achieving one object, one embodiment of the present invention provides a semiconductor device including a substrate, an oxide semiconductor layer, two source/drain regions, a high-k dielectric layer and a bottom oxide layer. The oxide semiconductor layer is disposed on a first insulating layer disposed on the substrate. The source/drain regions are disposed on the oxide semiconductor layer. The high-k dielectric layer covers the oxide semiconductor layer and the source structure and the drain regions. The bottom oxide layer is disposed between the high k-dielectric layer and the source/drain regions, wherein the bottom oxide layer covers the source/drain regions and the oxide semiconductor layer.

In achieving one object, one embodiment of the present invention provides a method for forming a semiconductor structure. First, a substrate having a first insulating layer formed thereon is provided. After forming an oxide semiconductor layer on the first insulating layer, two source/drain regions are formed on the oxide semiconductor layer. A bottom oxide layer is formed to entirely cover the source/drain regions, following by forming a high-k dielectric layer on the bottom oxide layer. Next, a thermal process is performed on the high-k dielectric layer, and a plasma treatment is performed on the high-k dielectric layer in the presence of a gas containing an oxygen element.

It is one salient feature of the present invention that an additional thermal oxygen treatment is performed to improve the quality of the oxide semiconductor layer which is used as a channel, thereby avoiding the oxygen vacancy phenomenon in conventional arts.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
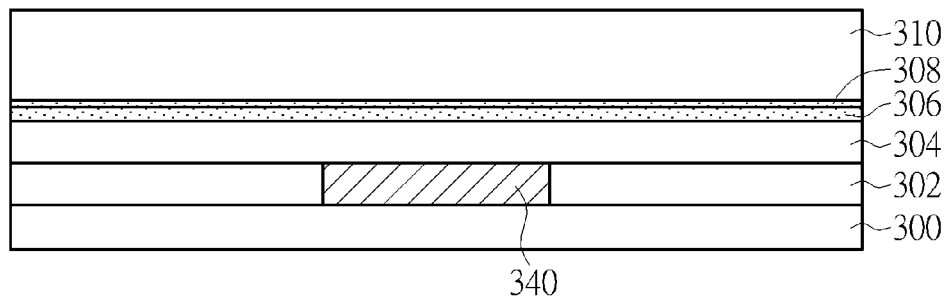
FIG. 1 to FIG. 7 show schematic diagrams of the method for forming a semiconductor structure according to one embodiment of the present invention.

To provide a better understanding of the presented invention, preferred embodiments will be described in detail. The preferred embodiments of the present invention are illustrated in the accompanying drawings with numbered elements.

Please refer to FIG. 1 to FIG. 7, showing schematic diagrams of the method for forming a semiconductor structure according to one embodiment of the present invention. First, a substrate 300 is provided and an insulation layer 302 and an insulation layer 304 are formed sequentially on the substrate 300. The substrate 300 can be any component that can serve as a base for forming devices. In one embodiment, the substrate 300 can comprise a semiconductor material, such as a silicon substrate, an epitaxial silicon substrate, a silicon germanium substrate, a silicon carbide substrate, a single crystal silicon substrate, a single crystal silicon germanium substrate, an amorphous silicon substrate, or a silicon on insulator (SOI), but it is not limited thereto. In one embodiment, one or more than one insulation layer (not shown) can be disposed between the substrate 300 and the insulation layer 302, and a metal interconnection system (not shown), an electronic device (not shown) such as metal oxide semiconductor (MOS), a photo-diode, a passive components such as an inductor, a capacitor or a resistor, can be formed in said insulation layer.

The insulation layer 302 or the insulation layer 304 may be a single layer or has a multi-layered structure, and the material thereof may be a low-k dielectric material such as silicon dioxide ($SiO_2$), or a high-k dielectric material, preferably a rare earth metal oxide such as hafnium oxide ($HfO_2$), but is not limited thereto. Generally speaking, a conductive layer can be formed in the insulation layer 302 and its material preferably is metal such as silver (Ag), copper (Cu), aluminum (Al), molybdenum (Mo), titanium (Ti), tantalum (Ta), cadmium (Cd), a nitride thereof, an oxide thereof, alloys thereof, or a combination thereof. Said conductive layer can have a pattern for being as a back gate electrode 340, as shown in FIG. 1.

In addition, an oxide semiconductor (OS) material layer 306 and a conductive material layer 310 are disposed on the substrate 300, sequentially stacking one the insulation layer 302 and the insulation layer 304. The OS material layer 306 may be a single layer or have a multilayered structure, wherein each may contain the same or different materials, e.g., indium gallium zinc oxide (InGaZnO), indium tin oxide (ITO), indium zinc oxide (IZO), cadmium tin oxide (CTO), aluminum zinc oxide (AZO), indium tin zinc oxide (ITZO), zinc oxide, cadmium oxide, hafnium oxide (HID), indium gallium zinc magnesium oxide (InGaZnMgO), indium gallium magnesium oxide (InGaMgO) or indium gallium aluminum oxide (InGaAlO), and is not limited thereto. Preferably, it contains C-axis aligned crystal InGaZn (CAAC-InGaZnO), that exhibits high carrier mobility and low leakage current and can serves as a channel layer of the bottom gate electrode 340. It is understood for one skilled in the art that the OS material layer 306 may have other material or may have multi layers, wherein each layer has the same or different material, which is not limited to above embodiment.

In one embodiment, an insulation layer 308 can be formed on the OS material layer 306, as shown in FIG. 1. It is worth noting that the insulation layer 308 is preferably composed an oxide semiconductor material, such as indium gallium zinc oxide (InGaZnO), indium gallium oxide (IGaO), indium zinc oxide (IZO), indium zinc oxide (IZO), and is not limited thereoto. Preferably, the material of the OS in the insulation layer 308 is different that of the OS material layer 306, and a thickness of the insulation layer 308 is less than that of the OS material layer 306, but is not limited thereto. By doing this, the insulation layer 308 can serve as a barrier layer.

Figure 2:
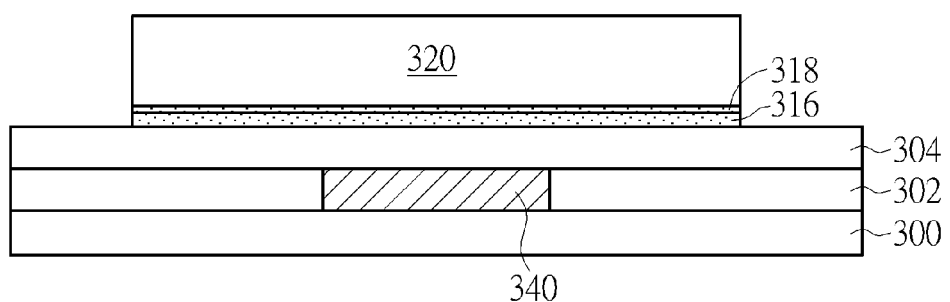
Figure 3:
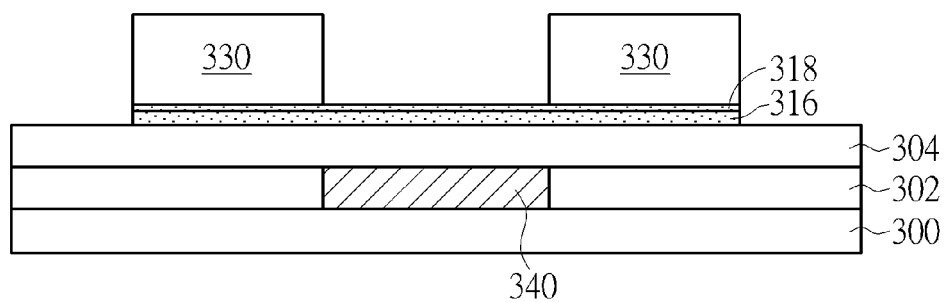

Next, the OS material layer 306 and the conductive material layer 310 are patterned to form a patterned OS layer 316 and a patterned conductive layer 320. The patterning process may be carried out by one single photo-etching-process (PEP) or a plurality of PEPs. In one embodiment with the insulation layer 308, the OS material layer 306, the insulation layer 308 and the conductive material layer 310 can be patterned simultaneously wherein the insulation layer 304 is used as an etch stop layer. Accordingly, the sidewall of the patterned OS layer 316, the sidewall of the patterned insulation layer 318 and the sidewall of the patterned conductive layer 320 are vertically aligned with each other. As shown in FIG. 2, it is noted that the patterned OS layer 316 is disposed correspondingly to the bottom gate electrode 340, preferably, a projection of the bottom gate electrode 340 along a vertical direction of the substrate 300 is disposed at a center of the patterned OS layer 316.

Next, the patterned conductive layer 324 is patterned again to form two separate parts, preferably two source/drain regions (S/D region) 330 with the same width, wherein a part of the OS layer 316 or the insulation layer 318 is exposed by the two S/D regions 330. On the other hand, as described above, the outer sidewalls of the S/D region 330 are vertically aligned with the sidewall of the OS layer 316 and the sidewalls of the insulation layer 318. The patterning process may be carried out by one single PEP or a plurality of PEPs.

Figure 4:
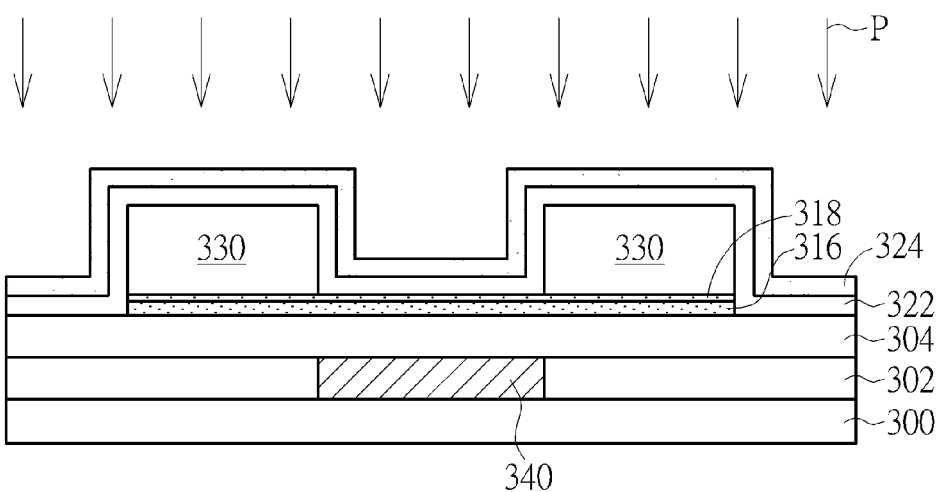

Thereafter, a dielectric layer is formed comprehensively on the substrate 300 and the S/D regions 330, in which it may be one single layer or have a multi-layered structure. Preferably, the dielectric layer includes a low-k dielectric material such as $SiO_2$, serving as a bottom oxide layer 322. Next, as shown in FIG. 4, a high-k dielectric layer 324 is formed conformally on the bottom oxide layer 322. In one embodiment, the material of the high-k dielectric layer 324 is metal oxide, preferably a rare earth metal oxide such as includes hafnium oxide ($HfO_2$), hafnium silicon oxide (HfSiO4), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), strontium bismuth tantalate ($SrBi_2Ta_2O_9$, SBT), lead zirconate titanate ($PbZr_xTi_{1-x}O_3$, PZT, barium strontium titanate ($Ba_xSr_{1-x}TiO_3$, BST) and is not limited thereto. It is noted that the bottom oxide layer 322 directly contacts the S/D regions and the exposed insulation layer 318 for protect the sidewall of the S/D regions 330 after patterning as well as the exposed insulation layer 318. As shown in FIG. 4, when there is no insulation layer 318, the bottom oxide layer 322 directly contacts the S/D region 330 and the exposed OS layer 316.

Subsequently, a thermal and oxygen ambience treatment P is performed on the high-k dielectric layer 324. The oxygen atom in the high-k dielectric layer 324 can be released during the thermal process, and the high-k dielectric layer 324 can be tuned by the oxygen ambience treatment, so as to avoid the oxygen vacancy phenomenon. In one embodiment, the thermal and oxygen ambience treatment P includes supplying gas containing $O_2$ under 300° C. to 500° C., preferably 100% $O_2$ gas under 400° C. It is understood for one skilled in the art that the thermal and oxygen ambience treatment P can also be performed by other process, and is not limited to the above steps. In another embodiment, the thermal process and the oxygen treatment can be performed in sequence, for example, a thermal process with 300° C. to 500° C. is performed firstly, and the oxygen treatment such as annealing process, rapid thermal annealing process or plasma treatment can be performed.

Figure 5:
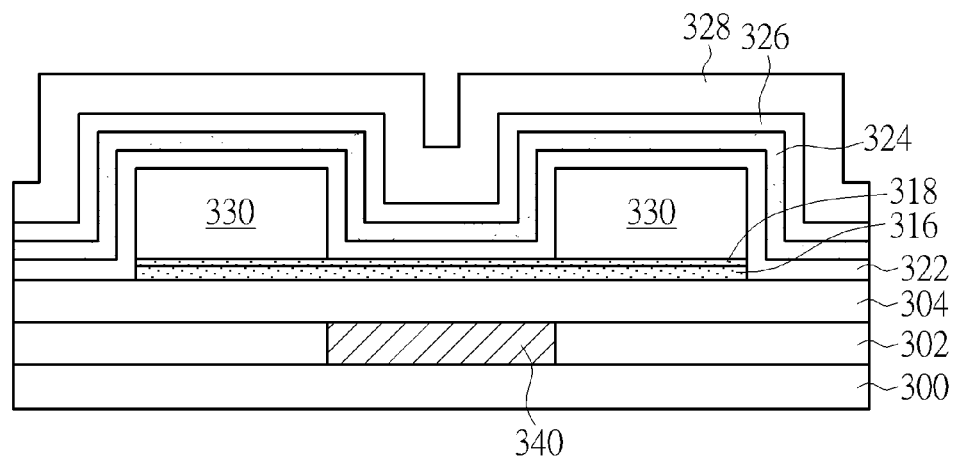

Subsequently, as shown in FIG. 5, a gate dielectric material layer 326 and a gate material layer 328 are formed conformally on the substrate 300. In one embodiment, the gate dielectric material layer 326 may be silicon dioxide layer or a high-k dielectric layer. The gate material layer 328 comprises a variety of conductive material, e.g., a metal layer comprising gold (Au), silver (Ag), copper (Cu), aluminum (Al), molybdenum (Mo), titanium (Ti), tantalum (Ta), cadmium (Cd), a nitride thereof, an oxide thereof, alloys thereof, or a combination thereof.

Figure 6:
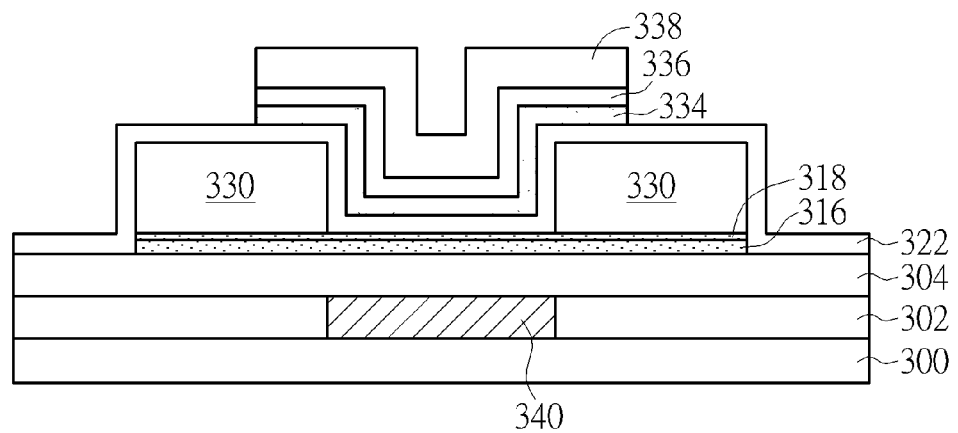

Next, the gate dielectric material layer 328, the gate material layer 326 and the below high-k dielectric layer 324 are patterned to respectively form a top gate electrode 338, a top oxide layer 336 and a high-k dielectric layer 334. It is noted that the top oxide layer 336, the high-k dielectric layer 334, and the below bottom oxide layer 322 together form a sandwich gate dielectric structure, serving as a gate dielectric layer of the top gate electrode 338. In the sandwich gate dielectric structure, only the sidewall of the top oxide layer 336 and the sidewall of the high-k dielectric layer 334 are vertically aligned with a sidewall of the top gate electrode 338, while the bottom oxide layer 322 completely covers the below substrate 300 and the S/D region 330, as shown in FIG. 6. Besides, it is noted that the method of forming the sandwich gate dielectric layer is not limited to above embodiment, and in another embodiment, depending on the design requirements, only the gate material layer 328 is patterned, or only the gate material layer 328 and the gate dielectric material layer 326 are patterned, or all the gate material layer 328, the gate dielectric material layer 326, the high-k dielectric layer 324 and the below bottom oxide layer 322 are patterned, therefore forming different sandwich gate dielectric structures (not shown).

Subsequently, a dielectric layer 342 is formed on the base 300 for covering the bottom oxide layer 322, the top gate electrode 338 and other structures. A plurality of via plugs 344, 346 are formed in the dielectric layer 342 to electrically connect the S/D region 326 and the top gate electrode 338, respectively. In the present embodiment, the via plug 344 penetrates through the bottom oxide layer 322 to electrically connect the S/D region 330.

Figure 7:
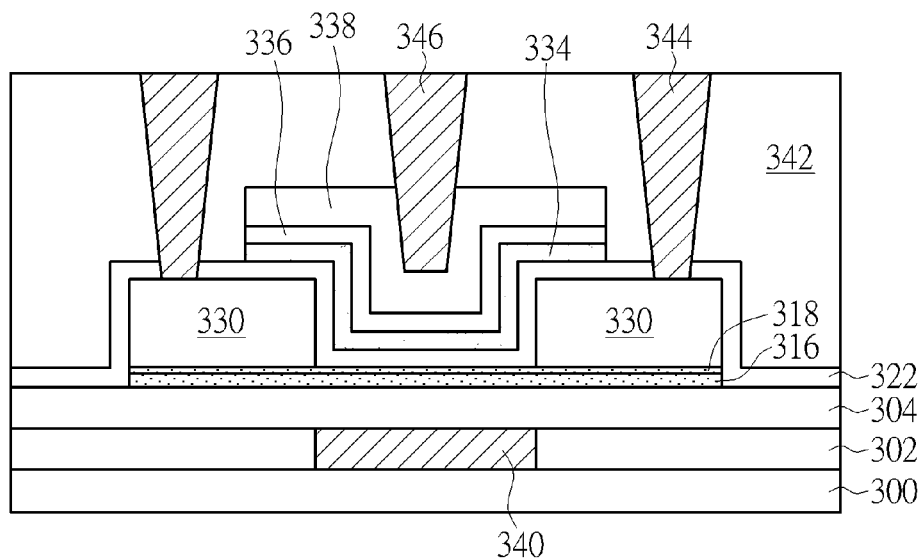

In one embodiment, the via plug 344 may comprise an outer barrier layer such as titanium nitride (TiN), and an inside metal layer such as tungsten (not shown), but is not so limited. In one preferred embodiment, the plug trench (not shown) of the via plugs 344, 346 are formed by using double patterning lithography or multiple patterning process. In other words, a photolithography-etch-photolithography-etch (2P2E) process is carried out with multi steps thereto form the plug trench accessing to the top electrode 338 and the S/D region 330 so as to form the via plugs 344, 346 respectively, as shown in FIG. 7.

After the above steps, a semiconductor structure of the present invention is therefore obtained. As shown in FIG. 7, the semiconductor structure of the present invention includes a substrate 300, an insulation layer 304 on the substrate 300, two S/D regions 330, a bottom gate electrode below the insulation layer 304 and the top gate electrode above the insulation layer 304. The semiconductor structure of the present invention therefore has a dual gate transistor structure, for example, a C-axis aligned crystal OS MOSFET (CAAC-OS MOSFET), wherein the bottom gate electrode structure comprises the bottom gate electrode 340 in the insulation layer 302 and the OS layer 316 serving as a channel layer, and the bottom gate electrode at least partially overlaps with the OS layer 316. On the other hand, the top gate electrode structure comprises the top gate electrode 338 disposed on the insulation layer and between the two S/D regions 330, the OS layer 316 serving as a channel layer, and a sandwich gate dielectric structure, and the top gate electrode 338 at least partially overlaps with the OS layer 316. In one embodiment, the sandwich gate dielectric structure includes the bottom oxide 322, the high-k dielectric layer 334 and the top oxide layer 336.

According to the above description, the present invention also provides a method for forming a semiconductor structure. It is one salient feature that an additional thermal and oxygen ambience treatment on the high-k dielectric layer. The oxygen atom in the high-k dielectric layer can be released during the thermal process, and the high-k dielectric layer can be tuned by the oxygen ambience treatment, so as to avoid the oxygen vacancy phenomenon. In addition, only the sidewall of the top oxide layer 336 and the sidewall of the high-k dielectric layer 334 are vertically aligned with a sidewall of the top gate electrode 338, while the bottom oxide layer 322 completely covers the below substrate 300 and the S/D region 330. By doing this, when forming the via plugs in the subsequent steps, the bottom oxide layer can protect the below S/D region and the OS layer from damage, thereby upgrading the device performance.

To one skilled in the art, it is understood that the semiconductor structure can also be formed by other method and is not limited to above embodiment. Thus, the following context will show other embodiment of the method for forming a semiconductor structure. In simplify the description, the below description only shows the different components or steps while omitting the similar steps or components. Besides, similar components will be given the same reference number in order to make each embodiment clear.

Figure 8:
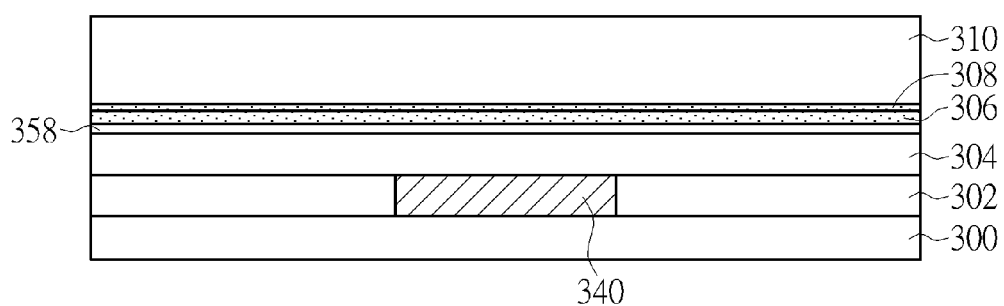
FIG. 8 to FIG. 9 show schematic diagrams of the method for forming a semiconductor structure according to another embodiment of the present invention.
Figure 9:
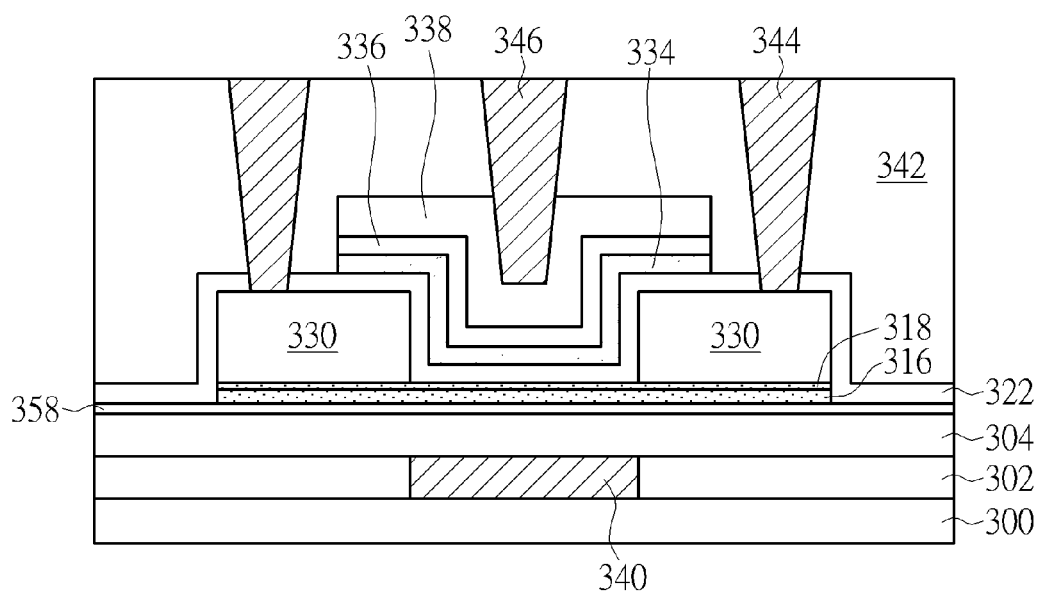

Please refer to FIG. 8 and FIG. 9, showing a schematic diagram of a method for forming a semiconductor structure according to one embodiments of the present invention, wherein the initial steps of this embodiment are similar to the previous embodiment. After forming substrate 300, the insulation layer 302, the OS material layer 306 and the conductive material layer 310, another insulation layer 358 can be formed on the OS material layer 306 and the bottom gate electrode 340, as shown in FIG. 8. In one embodiment, the insulation layer 358 includes indium gallium zinc oxide (InGaZnO), indium tin oxide (ITO), indium zinc oxide (IZO), cadmium tin oxide (CTO), aluminum zinc oxide (AZO), indium tin zinc oxide (ITZO), zinc oxide, cadmium oxide, hafnium oxide (HfO), indium gallium zinc magnesium oxide (InGaZnMgO), indium gallium magnesium oxide (InGaMgO) or indium gallium aluminum oxide (InGaAlO), and is not limited thereto. The material of the insulation layer 358 is different that of the OS material layer 306, and a thickness of the insulation layer 358 is less than that of the OS material layer 306, but is not limited thereto. By doing this, the insulation layer 358 can serve as a barrier layer.

Subsequently, the steps shown in FIG. 2 to FIG. 9 can be carried out. In the final structure, as shown in FIG. 9, the semiconductor structure also comprises the substrate 300, the insulation layer 304 on the substrate 300, the S/D region 330, a bottom gate electrode below the insulation layer 304 and the top gate electrode above the insulation layer 304.

According to the above description, the present invention also provides a method for forming a semiconductor structure according to another embodiment. It is featured that another insulation layer is formed between the OS material layer and the bottom gate electrode and can be serve as a protective layer. By doing this, the OS layer can be protected from damage in the subsequent steps.

In summary, the present invention provides a semiconductor structure. The manufacturing steps thereof comprise an additional thermal and oxygen ambience treatment so as to improve the quality of the OS layer serving as a channel and therefore upgrading the device performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
a substrate;
an oxide semiconductor layer disposed on a first insulating layer disposed on the substrate;
two source/drain regions disposed on the oxide semiconductor layer;
a high-k dielectric layer covering the oxide semiconductor layer and the source/drain regions; and
a bottom oxide layer between the high-k dielectric layer and the source/drain regions, covering the source/drain regions and the oxide semiconductor layer; and
a second insulating layer disposed between the oxide semiconductor layer and the source/drain regions, wherein a sidewall of each source/drain region is vertically aligned with a sidewall of the oxide semiconductor layer and a sidewall of the second insulating layer, and the bottom oxide layer directly contacts the sidewall of the source/drain region, the sidewall of the oxide semiconductor layer and the sidewall of the second insulating layer.
2. The semiconductor device according to claim 1, wherein the second insulating layer comprises an oxide semiconductor material different from that of the oxide semiconductor layer.

3. The semiconductor device according to claim 1, wherein the second insulating layer has a thickness smaller than that of the oxide semiconductor layer.

4. The semiconductor device according to claim 1, wherein the second insulating layer and the oxide semiconductor layer comprise indium gallium zinc oxide (InGaZnO), InGaO2, InZnO2, GaInO, ZnInO, or GaZnO.

5. The semiconductor device according to claim 1, further comprising:
a second gate electrode disposed below the oxide semiconductor layer and overlapped the oxide semiconductor layer.

6. The semiconductor device according to claim 5, further comprising:
a third insulating layer disposed between the oxide semiconductor layer and the second gate electrode, wherein the third insulating layer comprises a oxide semiconductor material different from the oxide semiconductor layer.

7. The semiconductor device according to claim 1, wherein the oxide semiconductor layer comprises a monolayer structure or a multilayer structure.

8. A semiconductor device, comprising:
a substrate;
an oxide semiconductor layer disposed on a first insulating layer disposed on the substrate;
two source/drain regions disposed on the oxide semiconductor layer;
a high-k dielectric layer covering the oxide semiconductor layer and the source/drain regions;
a bottom oxide layer between the high-k dielectric layer and the source/drain regions, covering the source/drain regions and the oxide semiconductor layer;
a top oxide layer disposed on the high-k dielectric layer, wherein the bottom oxide layer, the high-k dielectric layer and the top oxide layer consists of a sandwiched gate dielectric structure; and
a first gate electrode disposed between the two source/drain regions and on the sandwiched gate dielectric structure, wherein the first gate electrode overlaps the oxide semiconductor layer, and a sidewall of the top oxide layer and the a sidewall of high-k dielectric layer are vertically aligned with a sidewall of the first gate electrode.

9. A semiconductor device, comprising:
a substrate;
an oxide semiconductor layer disposed on a first insulating layer disposed on the substrate;
two source/drain regions disposed on the oxide semiconductor layer;
a high-k dielectric layer covering the oxide semiconductor layer and the source/drain regions;
a bottom oxide layer between the high-k dielectric layer and the source/drain regions, covering the source/drain regions and the oxide semiconductor layer, wherein the bottom oxide layer directly contacts the source/drain regions; and
two via plugs electrically connected to the two source/drain regions respectively, wherein the via plugs contact the bottom oxide layer and do not contact the high-k dielectric layer.

* * * * *